US 8,056,142 B2

(12) United States Patent
Youm et al.

(10) Patent No.: US 8,056,142 B2
(45) Date of Patent: Nov. 8, 2011

(54) APPARATUS AND METHOD OF AUTHENTICATING JOINT TEST ACTION GROUP (JTAG)

(75) Inventors: Yun-ho Youm, Seoul (KR); Mi-jung Noh, Yongin-si (KR); Hong-mook Choi, Bucheon-si (KR); Xingguang Feng, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 86 days.

(21) Appl. No.: 12/653,082

(22) Filed: Dec. 8, 2009

(65) Prior Publication Data

US 2010/0153797 A1  Jun. 17, 2010

(30) Foreign Application Priority Data

Dec. 17, 2008  (KR) .................. 10-2008-0128616

(51) Int. Cl.
*G06F 7/04* (2006.01)
*G06F 17/30* (2006.01)
*H04N 7/16* (2006.01)
(52) U.S. Cl. ............... 726/27; 714/726; 726/2; 726/26
(58) Field of Classification Search ............ None
See application file for complete search history.

(56) References Cited

U.S. PATENT DOCUMENTS

| | | | |
|---|---|---|---|
| 6,484,308 B1 * | 11/2002 | Pearce et al. ............ | 717/128 |
| 6,523,099 B1 | 2/2003 | Namekawa | |
| 6,769,065 B2 * | 7/2004 | Mayer ....................... | 726/2 |
| 6,968,420 B1 * | 11/2005 | Giles et al. ............... | 711/103 |
| 7,058,856 B2 * | 6/2006 | Shinmori .................. | 714/30 |
| 7,080,789 B2 * | 7/2006 | Leaming ................... | 235/492 |
| 7,231,552 B2 * | 6/2007 | Parker et al. ............. | 714/30 |
| 7,266,848 B2 * | 9/2007 | Moyer et al. ............. | 726/29 |
| 7,345,502 B1 * | 3/2008 | Lakkapragada et al. .... | 326/8 |
| 7,363,564 B2 * | 4/2008 | Moss et al. ............... | 714/734 |
| 7,600,166 B1 * | 10/2009 | Dunn et al. ............... | 714/726 |
| 7,772,853 B2 * | 8/2010 | Shimizu .................... | 324/538 |
| 7,823,214 B2 * | 10/2010 | Rubinstein et al. ....... | 726/34 |

FOREIGN PATENT DOCUMENTS

| | | |
|---|---|---|
| JP | 11-272560 A | 10/1999 |
| JP | 2003-186693 A | 7/2003 |

OTHER PUBLICATIONS

Buskey, R.F.; Frosik, B.B.; , "Protected JTAG," Parallel Processing Workshops, 2006. ICPP 2006 Workshops. 2006 International Conference on , vol., No., pp. 8 pp. 414, 0-0 0, 2006.*

* cited by examiner

*Primary Examiner* — Jeffrey A Gaffin
*Assistant Examiner* — Steve Nguyen
(74) *Attorney, Agent, or Firm* — Onello & Mello, LLP

(57) ABSTRACT

In an apparatus including a joint test action group (JTAG) authentication device, and a JTAG authentication method using the apparatus, the apparatus includes a joint test action group (JTAG) authentication device, the apparatus comprising a JTAG access circuit that determines whether to access a JTAG-compliant device according to a predetermined protocol that governs the JTAG-compliant device and the apparatus, wherein the JTAG access circuit at least one of inactivates at least one of inner bus lines and inner units and activates the at least one of the inner bus lines and the inner units according to whether the JTAG-compliant device is accessed.

9 Claims, 3 Drawing Sheets

APPARATUS AND METHOD OF AUTHENTICATING JOINT TEST ACTION GROUP (JTAG)

CROSS-REFERENCE TO RELATED APPLICATIONS

This application claims priority under 35 U.S.C. 119 to Korean Patent Application No. 10-2008-0128616, filed on Dec. 17, 2008 in the Korean Intellectual Property Office, the disclosure of which is incorporated herein in its entirety by reference.

BACKGROUND

1. Field

The inventive concept relates to an apparatus that determines whether the apparatus should access a joint test action group (JTAG) device, and more particularly, to an apparatus including a JTAG authentication device which is capable of performing authentication using a JTAG access circuit without correcting a JTAG controller mounted in the apparatus, and a method of authenticating the JTAG-compliant device using the apparatus.

2. Description of Related Art

A JTAG-compliant device can be used as a debugger when designing an embedded system. The JTAG-compliant device can check data stored in a memory of a device, and/or check input/output data, and/or check the states of functional blocks which are to be debugged, via a test access port (TAP) installed in the device. However, the JTAG-compliant device may also be used to extract important data of the device, sometimes which for illicit or malicious purposes.

In addition, there is trouble when a TAP controller is corrected in order to overcome the abovementioned problems. For example, in the case of a device that uses a core such as Advanced RISC Machines (ARM), a designer of the device may consider correcting inner circuits of the core. However, correcting such circuits is risky. Moreover, if there is no authority to correct the core, correction may not be possible.

Accordingly, a new authentication circuit needs to be added while obviating the need to correct the circuits.

SUMMARY

The inventive concept provides an apparatus including a joint test action group (JTAG) authentication device, wherein the apparatus includes a JTAG access circuit that determines whether to access a JTAG-compliant device without correcting existing circuits via a predetermined protocol which governs the JTAG-compliant device and the apparatus.

The inventive concept also provides a JTAG authentication method in which it is determined whether the JTAG-compliant device is accessed or not according to a predetermined protocol that governs the JTAG-compliant device and the apparatus.

According to an aspect of the inventive concept, there is provided an apparatus that performs joint test action group (JTAG) authentication, the apparatus comprising a JTAG access circuit that determines whether to access a JTAG-compliant device according to a predetermined protocol that governs the JTAG-compliant device and the apparatus, wherein the JTAG access circuit at least one of inactivates inner bus lines and inner units and activates the at least one of the inner bus lines and the inner units according to whether the JTAG-compliant device is accessed.

In an embodiment, the JTAG access circuit detects whether the JTAG-compliant device is connected to the apparatus, wherein when the JTAG access circuit detects that the JTAG-compliant device is connected to the apparatus, the JTAG access circuit inactivates the inner bus lines and the inner units, and determines whether JTAG recognition data applied from the JTAG-compliant device is consistent with comparison reference data, and wherein when the JTAG recognition data applied from the JTAG-compliant device is consistent with the comparison reference data, the JTAG access circuit activates at least one of the inactivated inner bus lines and the inactivated inner units.

In an embodiment, the JTAG access circuit comprises: a JTAG detector that generates an interface detection signal, which is activated when the JTAG-compliant device is connected to the apparatus; and a JTAG security circuit that inactivates at least one of the inner bus lines and the inner units in response to the interface detection signal, and activates at least one of the inner bus lines and the inner units by comparing JTAG recognition data of the JTAG-compliant device with the comparison reference data.

In an embodiment, the JTAG access circuit further comprises a storage medium storing the comparison reference data.

In an embodiment, the JTAG recognition data is output to the JTAG security circuit via a JTAG controller and a computer processing unit (CPU) mounted in the apparatus.

In an embodiment, the inner units comprise at least one of a memory block and a functional block.

In an embodiment, the memory block includes at least one type of a memory, wherein the functional block includes at least one functional circuit, and
wherein the JTAG access circuit activates at least one type of the memory or activates at least one functional circuit, or activates at least one type of a memory and at least one of the functional blocks.

According to an aspect of the inventive concept, there is provided a method of authenticating a joint test action group (JTAG), the method comprising: determining whether a JTAG-compliant device is connected to an apparatus including a JTAG authentication device; inactivating at least one of inner bus lines and inner units of the apparatus if the JTAG-compliant device is connected to the apparatus; comparing JTAG recognition data applied by the JTAG-compliant device with comparison reference data; and activating at least one of the inner bus lines and the inner units when the JTAG recognition data and the comparison reference data are consistent.

In an embodiment, when it is determined that the JTAG recognition data and the comparison reference data are inconsistent after comparing the JTAG recognition data with the comparison reference data, it is determined whether a JTAG-compliant device is connected to the apparatus including a JTAG authentication device or the receiving the JTAG recognition data from the JTAG-compliant device is performed.

Accordingly, dangers that may otherwise occur if a test access port (TAP) controller cannot be corrected at all or when correcting the TAP controller for a JTAG authentication can be minimized.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings, the thickness of layers and regions are exaggerated for clarity. In the drawings.

DETAILED DESCRIPTION OF EMBODIMENTS

Figure 1:
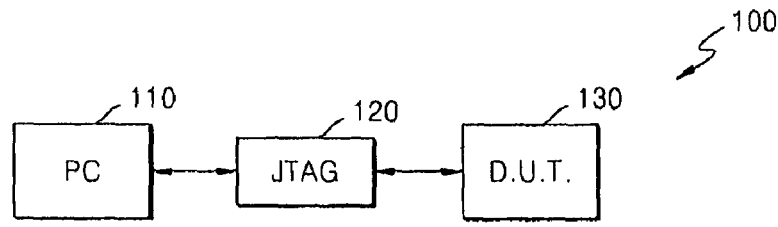
FIG. 1 is a schematic view of a configuration in which a joint test action group (JTAG) is used, according to an embodiment of the inventive concept.

The attached drawings for illustrating embodiments of the inventive concept are referred to in order to gain a sufficient understanding of the inventive concept, the merits thereof, and the objectives accomplished by the implementation of the inventive concept.

Various embodiments of the invention will be hereinafter described in detail with reference to the accompanying drawings. The inventive concept may however be embodied in different forms and should not be construed as limited to the embodiments set forth herein. Rather, these embodiments are provided so that this disclosure will be thorough and complete, and will fully convey the scope of the embodiments to those skilled in the art. Like reference numerals refer to like elements throughout the accompanying figures.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Although the terms first, second, and the like may be used in this specification to describe respective components or sections, these terms are used for clear description and these components or sections are not limited by these terms.

FIG. 1 is a schematic view of a configuration 100 in which a joint test action group (JTAG)-compliant device 120 is used, according to an embodiment of the inventive concept.

Referring to FIG. 1, the JTAG-compliant device 120 transmits a predetermined command generated by a debugging device 110 to an apparatus 130, also referred to as a device under test (D.U.T.), which, in an embodiment, is an embedded system, and transmits information pertaining to the apparatus 130 to the debugging device 110 in response to the command. In an embodiment, the debugging device 110 can be an exclusive test apparatus or a personal computer. In an embodiment, the apparatus 130 includes at least one of a calculation processing block, a memory block, and a functional block that can perform a predetermined function. In an embodiment, the apparatus 130 performs JTAG authorization.

Figure 2:
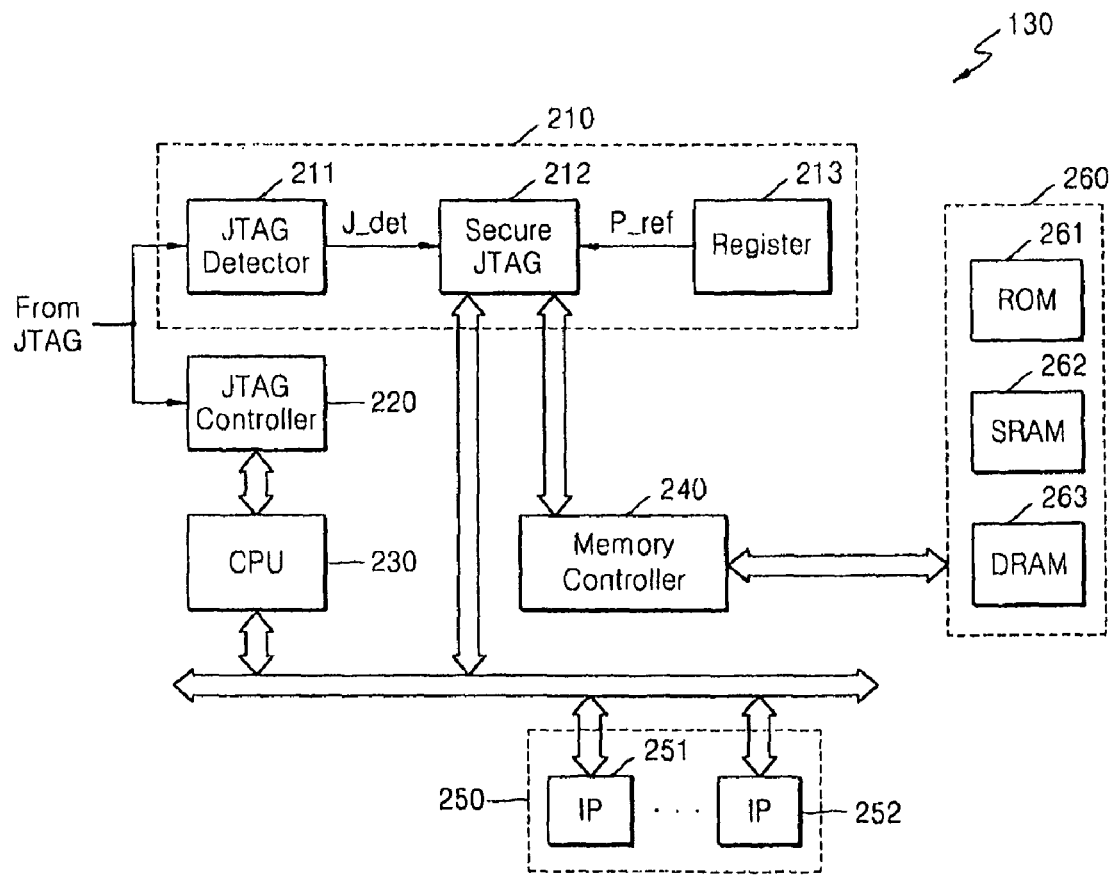
FIG. 2 is a block diagram illustrating an apparatus including a JTAG authentication device, according to an embodiment of the inventive concept.

FIG. 2 is a block diagram illustrating the apparatus 130 of FIG. 1 including a JTAG authentication device that performs JTAG authorization, according to an embodiment of the inventive concept.

Referring to FIG. 2, the apparatus 130 includes a JTAG access circuit 210, a JTAG controller 220, a central processing unit (CPU) 230, a memory controller 240, a functional block 250, and a memory block 260. Here, detailed description of features, functions, and operational characteristics of the JTAG controller 220, the CPU 230, the memory controller 240, the functional block 250, and the memory block 260, which are generally used in embedded systems, and are known to those of ordinary skill in the art, are omitted.

The JTAG access circuit 210 of the apparatus 130 determines whether to access the JTAG-compliant device 120 according to a predetermined protocol that governs the JTAG-compliant device 120 and apparatus 130 and is well-known to those of ordinary skill in the art.

The function of the JTAG access circuit 210 is described as follows:

The JTAG access circuit 210 detects whether the JTAG-compliant device 120 is connected to the apparatus 130, and if it is detected that the JTAG-compliant device 120 is connected to the apparatus 130, the JTAG access circuit 210 inactivates inner bus lines and/or elements of the apparatus 130 such as the functional block 250 and the memory block 260. Also, the JTAG access circuit 210 determines whether JTAG recognition data applied from the JTAG-compliant device 120 is consistent with comparison reference data P_ref, and if the two pieces of data are consistent, the JTAG access circuit 210 activates at least one of the inactivated inner bus lines and the inactivated elements such as the functional block 250 and the memory block 260.

In an embodiment, the JTAG recognition data can include an identity (ID) of the JTAG-compliant device 120, which interfaces between the apparatus 130 and the debugging device 110. In an embodiment, the JTAG recognition data may be output from the JTAG-compliant device 120 and be transmitted directly to the apparatus 130. In another embodiment, the JTAG recognition data may be output from the debugging device 110 and transmitted via the JTAG-compliant device 120 to the apparatus 130. Comparison reference data P_ref denotes data about the JTAG-compliant device 120, to which access can be achieved according to the apparatus 130. The apparatus 130 allows the JTAG-compliant device 120 to be accessed only if the JTAG recognition data and the comparison reference data P_ref are compared and determined to be consistent, thereby preventing illicit usage of the JTAG-compliant device 120.

In an embodiment, the JTAG access circuit 210 includes a JTAG detector 211, a JTAG security circuit 212, and a storage medium 213.

The JTAG detector 211 generates an interface detection signal J_det, which is output having an active state when the JTAG-compliant device 120 is connected to the apparatus 130.

The JTAG security circuit 212 inactivates at least one of inner bus lines and inner units or elements of the apparatus 130 such as the functional block 250 and the memory block 260, in response to the interface detection signal J_det, and compares JTAG recognition data with comparison reference data P_ref to determine whether to activate at least one of the inactivated inner bus lines and the inactivated inner units or elements such as the functional block 250 and the memory block 260.

The storage medium 213 stores the abovementioned comparison reference data P_ref. In an embodiment, the storage medium 213 includes a register.

The JTAG recognition data is output via the JTAG controller 220 and the CPU 230 to the JTAG security circuit 212. In an embodiment, the JTAG recognition data can be transmitted via a bus.

The elements of the apparatus 130 can include inner units such as the memory block 260 and the functional circuit 250. While the functional block 250 and the memory block 260 are illustrated in FIG. 2 as inner units, only one of these may also exist in an apparatus according to another embodiment. Also, the functional block 250 includes a plurality of functional circuits 251 and 252. In an embodiment, the functional circuits 251, 252 can comprise intellectual properties (IP). Also, the memory block 260 includes a read-only memory (ROM) 261, a static random access memory (SRAM) 262, and a dynamic random access memory (DRAM) 263. However, the memory block 260 may also include one and only one of the memory block 260 includes a read-only memory (ROM) 261, a static random access memory (SRAM) 262, and a dynamic random access memory (DRAM) 263.

Accordingly, the JTAG access circuit 210 may not only activate at least the whole or a portion of the memory block 260, or the whole or a portion of the functional block 250, but also the whole or a portion of the memory block 260 and the functional block 250.

Figure 3:
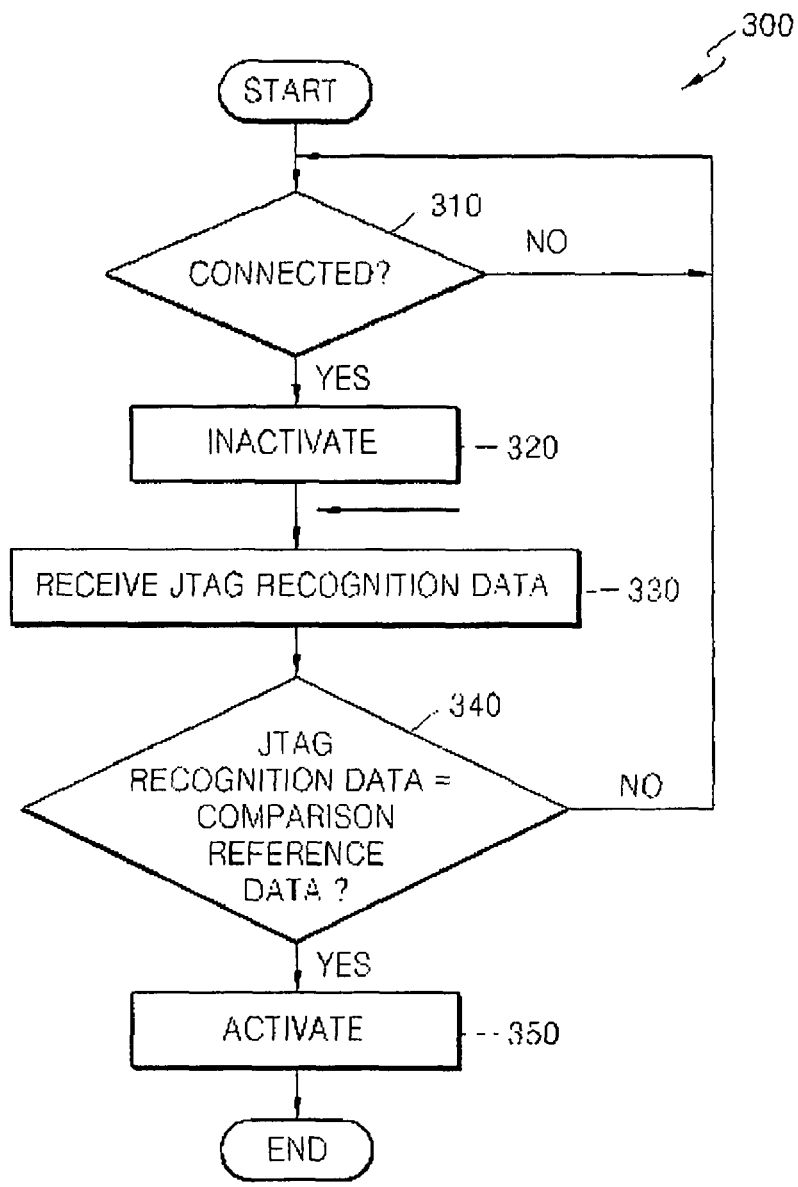
FIG. 3 is a flowchart illustrating a JTAG authentication method according to an embodiment of the inventive concept.

FIG. 3 is a flowchart illustrating a JTAG authentication method 300 according to an embodiment of the inventive concept.

Referring to FIG. 3, the JTAG authentication method 300 includes an interface determining operation (operation 310); an inactivating Operation (operation 320); a JTAG recognition data receiving operation (operation 330); a comparing operation (operation 340); and an activating operation (operation 350).

In the interface determining operation (operation 310), it is determined whether the JTAG-compliant device 120 is connected to the apparatus 130 including a JTAG authentication device. In the inactivating operation (operation 320), if the JTAG-compliant device 120 is connected to the apparatus 130, at least one of the inner bus lines and the inner units of the apparatus 130 are inactivated. In the JTAG recognition data receiving operation (operation 330), JTAG recognition data is received from the JTAG-compliant device 120 or the apparatus 130. In the comparing operation (operation 340), the JTAG recognition data and comparison reference data P_ref are compared. If the JTAG recognition data and the comparison reference data P_ref are consistent, at least one of the inner bus lines and the inner units is activated in the activating operation (operation 350).

On the other hand, if the JTAG recognition data and comparison reference data P_ref are inconsistent, the interface determining operation (operation 310) or the JTAG recognition data receiving operation (operation 330) is performed.

The received JTAG recognition data may be compared with the comparison reference data P_ref directly, or the JTAG recognition data may be processed according to predetermined standards and then may be compared with the comparison reference data P_ref.

Hereinafter, the operations of the apparatus 130 including a JTAG authentication function and a JTAG authentication method performed in the apparatus 130 according to an embodiment will be described further in detail with reference to FIGS. 2 and 3.

If the JTAG-compliant device 120 is not electrically connected to the apparatus 130, an interface detection signal J_det maintains its inactivated state, and the apparatus 130, which is an embedded system, performs its own unique functions.

Otherwise, if the JTAG-compliant device 120 is electrically connected to the apparatus 130, the JTAG detector 211 activates the interface detection signal J_det. In response to the activated interface detection signal J_det, the JTAG security circuit 212 inactivates the inner bus lines or the inner units such as the functional block 250 and the memory block 260. According to another embodiment of the inventive concept, only the inner bus lines or only the inner units may be inactivated, or all of the inner bus lines and the inner units may be inactivated, depending on whether the DUT 130 is to be debugged. The inner bus lines and the inner units are kept in an inactivated state until the authentication of the accessed JTAG-compliant device 120 is finished and access thereof is allowed, so as to prevent illicit usage of the JTAG-compliant device 120.

Next, the JTAG security circuit 212 receives JTAG recognition data output from the debugging device 110 or the JTAG-compliant device 120. Transmission of the JTAG recognition data may vary according to the configuration of the apparatus 130; here, for example, the JTAG recognition data is transmitted to the JTAG security circuit 212 via the JTAG controller 220 and the CPU 230.

The JTAG security circuit 212 compares the JTAG recognition data with comparison reference data P_ref, and if the two pieces of data are consistent, the JTAG security circuit 212 changes the state of the inactivated inner bus lines and the inactivated inner units to an activated state. However, if the two pieces of data are inconsistent, the JTAG security circuit 212 maintains the inner bus lines and the inner units at an inactivated state. In an embodiment, all of the inner bus lines and the inner units may be changed to an activated state. In another embodiment, just a portion of the inner bus lines and the inner units may be changed to an activated state according to data transmitted from the debugging device 110 or a security level granted to the JTAG-compliant device 120. In another embodiment, the states of the inner bus lines and the inner units may be sequentially changed.

In FIG. 2, the JTAG security circuit 212 directly instructs a command to change the state of the functional circuits 251 and 252 among the inner units, and the memory controller 240 indirectly instructs a command to change the state of the memory block 260. In other embodiments, however, the inventive concept is not limited thereto and other configurations are also possible.

Figure 4:
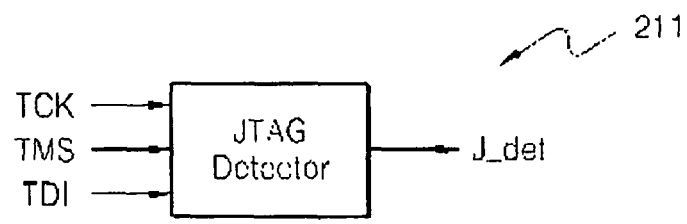
FIG. 4 illustrates an input/output signal of a JTAG detector, according to an embodiment of the inventive concept.

FIG. 4 illustrates an input/output signal of a JTAG detector, for example, JTAG detector 211 shown in FIG. 2.

Referring to FIG. 4, the JTAG detector 211 may activate an interface detection signal J_det by using a clock signal TCK, a mode signal TMS, and input data TDI, which are input to the JTAG detector 211 from the JTAG-compliant device 120.

Figure 5:
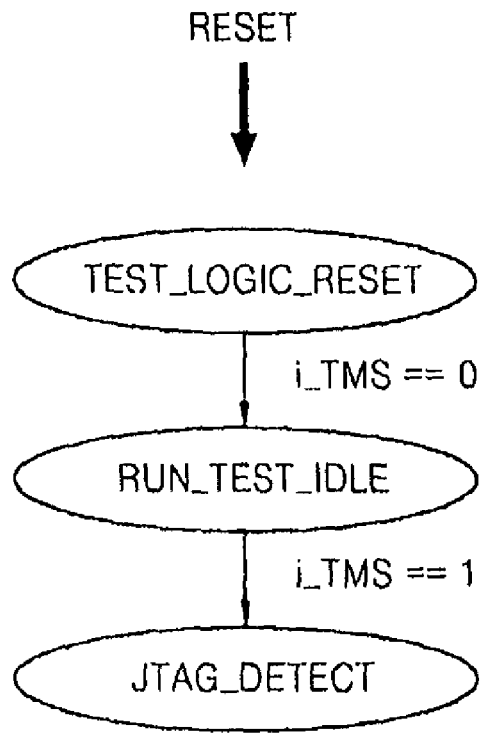
FIG. 5 is a schematic view of an interface detection signal J_det being activated using a test access port (TAP) state machine, according to an embodiment of the inventive concept.

FIG. 5 is a schematic view of an interface detection signal J_det being activated using a test access port (TAP) state machine according to an embodiment of the inventive concept.

Referring to FIG. 5, after being reset, the TAP state machine enters a reset state TEST_LOGIC_RESET, and then is converted to a test idle state RUN_TEST_IDLE when a mode signal TMS is at a logic low state ("0"). Then when the mode signal TMS is transitioned from the logic low state to a logic high state ("1"), an interface detection signal J_det is activated.

Figure 6:
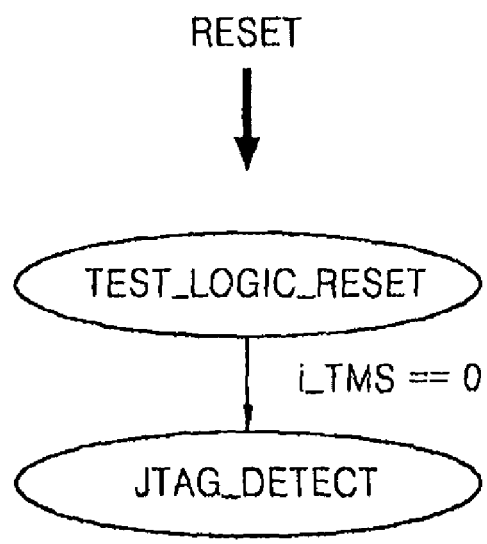
FIG. 6 is a schematic view of an interface detection signal J_det being activated using a TAP state machine according to another embodiment of the inventive concept.

FIG. 6 is a schematic view of an interface detection signal J_det being activated using a TAP state machine according to another embodiment of the inventive concept.

Referring to FIG. 6, after being reset, the TAP state machine enters a reset state TEST_LOGIC_RESET, and then activates an interface detection signal J_det when a mode signal TMS is at a logic low state ("0").

As shown in FIGS. 5 and 6, various methods of activating an interface detection signal J_det are possible, but not all of them are described here. While the inventive concept has been particularly shown and described with reference to exemplary embodiments thereof, it will be understood that various changes in form and details may be made therein without departing from the spirit and scope of the following claims.

What is claimed is:

1. An apparatus that performs joint test action group (JTAG) authentication, the apparatus comprising a JTAG access circuit that determines whether to access a JTAG-compliant device according to a predetermined protocol that governs the JTAG-compliant device and the apparatus, wherein:
the JTAG access circuit at least one of inactivates at least one of inner bus lines and inner units and activates the at least one of the inner bus lines and the inner units according to whether the JTAG-compliant device is accessed, wherein the JTAG access circuit detects whether the JTAG-compliant device is connected to the apparatus, wherein when the JTAG access circuit detects that the JTAG-compliant device is connected to the apparatus, the JTAG access circuit inactivates the inner bus lines and the inner units, and determines whether JTAG recognition data applied from the JTAG-compliant device is consistent with comparison reference data, and wherein when the JTAG recognition data applied from the JTAG-compliant device is consistent with the comparison reference data, the JTAG access circuit activates at least one of the inactivated inner bus lines and the inactivated inner units.

2. The apparatus of claim 1, wherein the JTAG access circuit comprises:
a JTAG detector that generates an interface detection signal, which is activated when the JTAG-compliant device is connected to the apparatus; and
a JTAG security circuit that inactivates at least one of the inner bus lines and the inner units in response to the interface detection signal, and activates at least one of the inner bus lines and the inner units by comparing JTAG recognition data of the JTAG-compliant device with the comparison reference data.

3. The apparatus of claim 2, wherein the JTAG access circuit further comprises a storage medium storing the comparison reference data.

4. The apparatus of claim 2, wherein the JTAG recognition data is output to the JTAG security circuit via a JTAG controller and a computer processing unit (CPU) mounted in the apparatus.

5. The apparatus of claim 1, wherein the inner units comprise at least one of a memory block and a functional block.

6. The apparatus of claim 5, wherein the memory block includes at least one type of a memory, wherein the functional block includes at least one functional circuit, and
wherein the JTAG access circuit activates at least one type of the memory or activates at least one functional circuit, or activates at least one type of a memory and at least one of the functional blocks.

7. A method of authenticating a joint test action group (JTAG) device, the method comprising:
determining whether a JTAG-compliant device is connected to an apparatus including a JTAG authentication device;
inactivating at least one of inner bus lines and inner units of the apparatus when the JTAG-compliant device is connected to the apparatus;
comparing JTAG recognition data applied by the JTAG-compliant device with comparison reference data; and
activating at least one of the inner bus lines and the inner units when the JTAG recognition data and the comparison reference data are consistent.

8. The method of claim 7, further comprising receiving the JTAG recognition data from the JTAG-compliant device.

9. The method of claim 8, wherein when it is determined that the JTAG recognition data and the comparison reference data are inconsistent after comparing the JTAG recognition data with the comparison reference data, it is determined whether a JTAG-compliant device is connected to the apparatus including a JTAG authentication device or whether the receiving the JTAG recognition data from the JTAG-compliant device is performed.

* * * * *